AUDIO POWER AMPLIFIER UTILIZING MULTIPLE FEEDBACK LOOPS

Filed June 25, 1963 2 Sheets-Sheet 1

Inventor
G. Christian Dencker
By Mann, Brown & McWilliams,
Attys.

AUDIO POWER AMPLIFIER UTILIZING MULTIPLE FEEDBACK LOOPS

Filed June 25, 1963 2 Sheets-Sheet 2

Inventor
G. Christian Dencker
By Mann, Brown & McWilliams.
Attys.

3,263,180
AUDIO POWER AMPLIFIER UTILIZING MULTIPLE FEEDBACK LOOPS
Gunther Christian Dencker, 1905 Jenks St., Evanston, Ill.
Filed June 25, 1963, Ser. No. 290,504
4 Claims. (Cl. 330—81)

This invention relates to an audio power amplifier and the principal object of the invention is to provide an audio power amplifier that utilizes as much as 50 dbs of negative feedback without sacrificing stability.

Generally speaking, this is accomplished by the use of a four-stage tube amplifier driving a speaker through an output transformer, with the main feedback loop connected from the transformer secondary to the cathode of the first stage tube. Phase shift at the very low and high frequencies is controlled by inner loops that are keyed to the roll-off characteristics of the output transformer.

Other objects and advantages will become apparent during the course of the following description.

Figure 1:
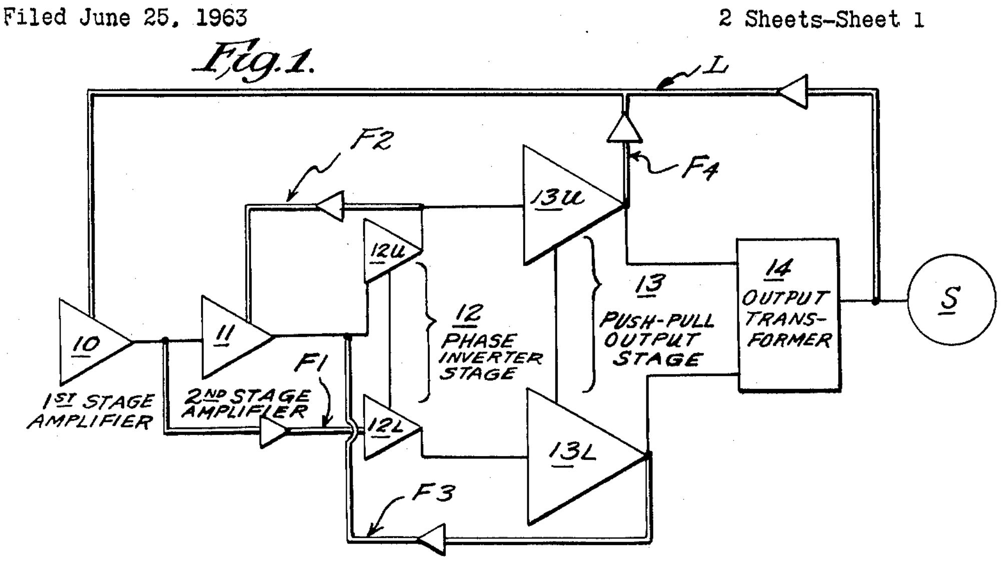
FIG. 1 is a block diagram of the amplifier of this invention.

Referring now to the drawings, the audio power amplifier of this invention is shown in block diagram form in FIG. 1 as comprising first and second amplifier stages 10 and 11, a phase inverter third stage 12, and a push-pull output stage 13 driving a speaker S through an output transformer 14.

In current practice it is usual to employ a single amplifier stage and for this design 25 dbs of feedback is the maximum that can be provided without lowering the sensitivity so far that no preamplifier could drive it. Of the equipment currently available, 0.5% intermodulation distortion is about the lowest obtainable.

According to this invention, drastically lower values of IM distortion are achieved by utilizing a second stage of voltage amplification in the input of the amplifier to make available the gain required (for example, 30 dbs additional) to accommodate 40 dbs of negative feedback which are provided by the main loop L which is shown connected from the secondary of the output transformer 14 to a control point within the first stage 10. While feedback levels of this order have been considered impossible because phase shift at the very low and very high frequency ends causes instability and oscillations, the amplifier of this invention has proven to be more stable at 50 dbs of negative feedback than are current amplifiers employing 20 dbs. For this purpose, loops F1 to F4 are provided to function in conjunction with the main loop L and all of these loops are shown by double lines in the diagram of FIG. 1, for convenience of illustration.

Figure 2:
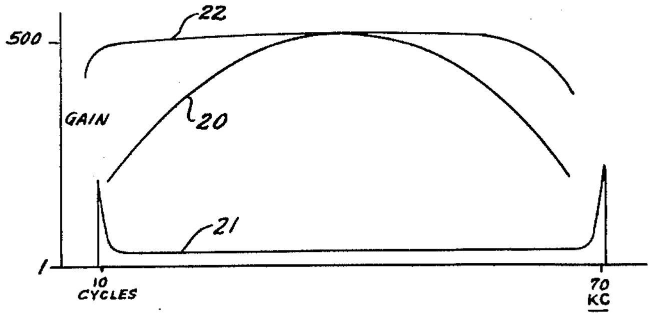
FIG. 2 is a graph of the response curve of the amplifier with and without feedback.

With this general description it is pertinent to compare the response curves shown in FIG. 2. Curve 20 shows the frequency response of the amplifier stages without any feedback or corrective loops, and the gain drops off sharply at both the high and low ends of the range of 10 cycles to 70 kc. The effect of applying only the 50 db main feedback loop to the amplifier is represented in curve 21 wherein the gain is held uniformly low throughout the range but peaks at the extremes, and this again indicates severe oscillation at these points. In accordance with this invention, the corrective loops F1 to F4 acting in conjunction with the main loop L control the amplifier in a fashion to provide a response curve which, as represented at 22, is uniformly flat over the entire range (10 cycles to 70 kc.). One important characteristic apparent in curve 22 is the very gradual drop-off in gain as distinguished from the sharp drop-off in gain at the extremes in curve 20, which in turn leads to the oscillations.

Figure 3:
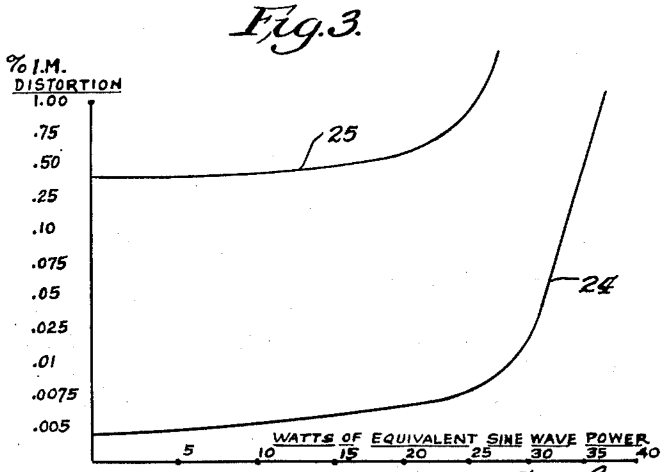
FIG. 3 is a graph of the intermodulation distortion characteristic of the amplifier as compared with equipment currently available.

FIG. 3 compares the intermodulation distortion performance of the amplifier of this invention with that of a typical amplifier currently available. Curve 24 shows the distortion curve for the present amplifier and curve 25 shows that for the typical amplifier presently available. These intermodulation distortion curves are derived in the standard fashion. Signals of 60 and 6,000 cycles mixed four to one are applied and with the present amplifier the intermodulation distortion is not measurable below 20 watts of equivalent sine wave power. There are not available any audio analyzers having internal leakage of less than .03 percent and therefore in curve 24 the distortion at the lower power ranges is estimated by extrapolation. On this basis for power levels up to 20 or 25 watts, IM is on the order of .01 percent.

Figure 4:
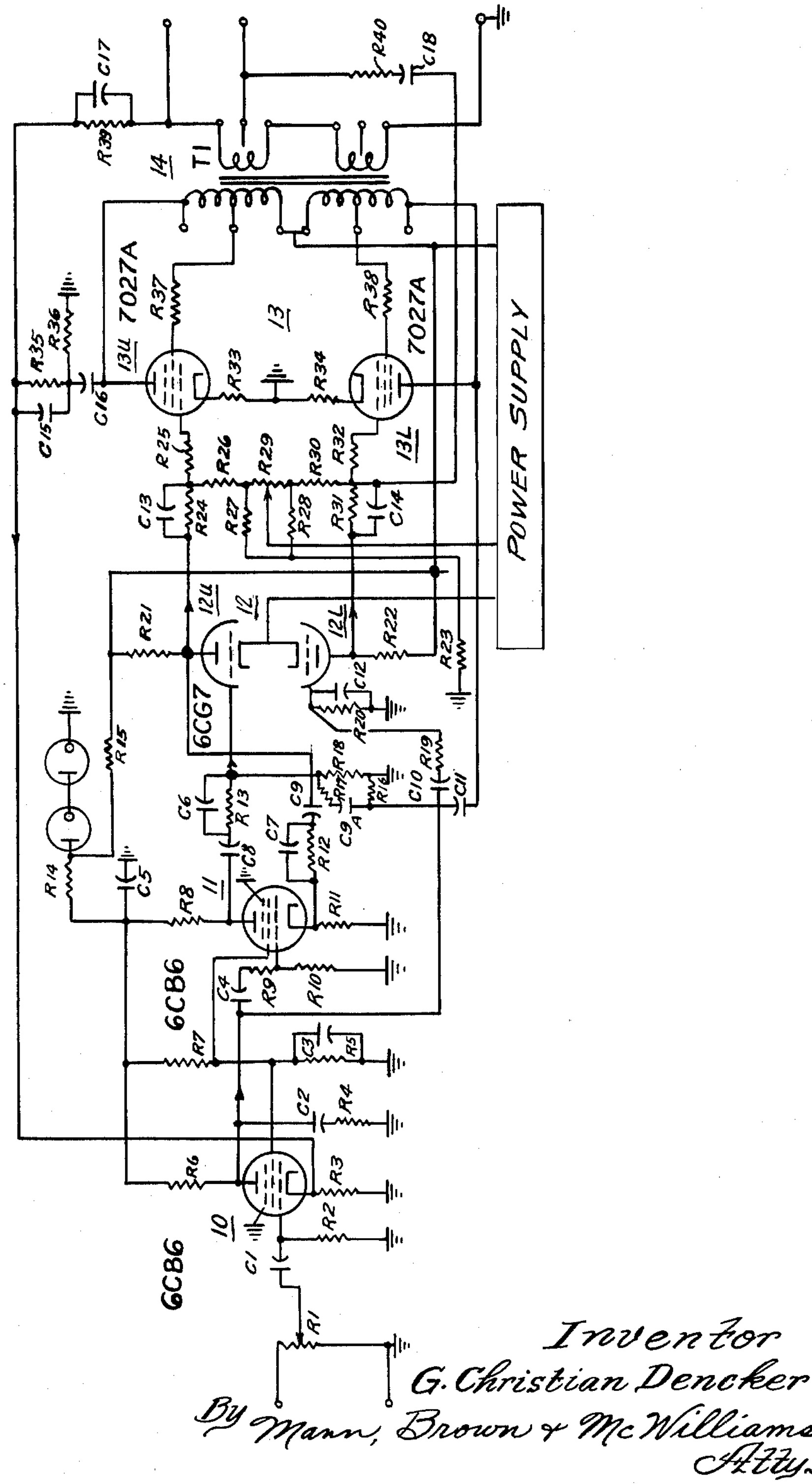
FIG. 4 is a detailed wiring diagram of the amplifier.

Low frequency stability is provided in accordance with this invention by the use of a positive feed forward path F1 shown connecting the output of the first stage 10 to a control point within the lower half 12L of the phase inverter stage 12. The phase inverter stage 12 is connected with the power stage 13 by means of an interstage coupling designed to provide the proper bias on the output tubes of the power stage. With reference particularly to FIGURE 4, the interstage coupling from the output of each of the sections 12U and 12L of the phase inverter stage 12 to each of the sections 13U and 13L of the push-pull power stage is essentially D.C. so that no low frequency phase shift is introduced between these stages. Proper bias on the output tubes of the power stage is accomplished by balancing the potential across resistors R24, R26 and half of R29 with the potential across R31, R30 and the other half of R29. Thus, by use of a single potentiometer, the current output of the sections 13U and 13L is readily balanced. Further, by virtue of the ratio of the resistances R24 to R26 and R31 to R30, which is approximately 10 to 1, the desired grid bias is provided to operate the output tubes within their dissipation range. Accordingly, the A.C. signal is passed to the power stage in a very low phase shift. This, in effect, compensates for the presence of an additional stage of amplification which, in its interstage coupling, introduces some additional phase shift into the system. The time constants in the forward loop F1 are of a value to balance out low frequency phase shift between the first and third stages to substantially zero degrees. Thus, the overall low frequency phase shift for the two amplification stages, 10 and 11, the phase inverter stage 12, and the power stage 13, is quite low and is substantially smaller than the phase shift contributed by the output transformer 14 which, at very low frequencies, will never be less than 90°.

A number of feedback loops are employed to provide high frequency stability, each loop being directed to a particular range of high frequency oscillations. Without any corrective loops the circuit oscillates at the resonant frequency of the output transformer 14 which is usually around 70 kc. In addition, oscillations occur at the harmonics of 70 kc. and have been measured at frequencies as high as 700 kc. Loop F3 is connected from the output of the lower section 13L of the push-pull stage 13 to provide negative feedback at the output of the second amplifier stage 11, and its time constants are selected to handle oscillations above 500 kc. Loop F4 is connected from the output at the upper section 13U of the push-pull stage 13 to the main feedback loop L which is connected to a control point within the first amplifier stage. Loop F4 has time constants selected to pass frequencies above 100 kc. Finally, loop F2 is connected from output at the upper section of the phase inverter stage 12 to a control point wtihin the second amplifier stage 11 and has time constants selected to pass frequencies in the range of 20 kc. and above.

A complete wiring diagram for the amplifier is shown in FIG. 4 and values for the circuit elements identified on the diagram are given below.

| | |
|---|---|
| R1—100K | R30—100K |
| R2—1 meg. | R31—1 meg. |
| R3—470 | R32—6800 |
| R4—3300 | R33—22 |
| R5—82K | R34—22 |
| R6—56K | R35—68K |
| R7—100K | R36—22K |
| R8—56K | R37—220 |
| R9—3900 | R38—220 |
| R10—1 meg. | R39—8200 |
| R11—470 | C1—.0033 |
| R12—33K | C2—680 pf. |
| R19—390K | C3—10 mf. |
| R14—1800 | C4—1500 pf. |
| R15—8000 | C5—20 mf. |
| R16—10K | C6—560 pf. |
| R17—2700 | C7—560 pf. |
| R18—1 meg. | C8—.5 mf. |
| R19—390K | C9—4700 pf. |
| R20—1 meg. | C10—.5 mf. |
| R21—22K | C11—200 pf. |
| R22—27K | C12—6800 pf. |
| R23—18K | C13—.022 mf. |
| R24—1 meg. | C14—.022 mf. |
| R25—6800 | C15—47 pf. |
| R26—100K | C16—25 pf. |
| R27—3900 | C17—200 pf. |
| R28—3900 | C18—330 pf. |
| R29—5000 | D1, D2—Silicon diode 200 PIV |

The preferred tube types are specified on the wiring diagram and it will be noted that the first and second stages of amplification 10 and 11 employ pentodes having a high transconductance characteristic which is advantageous where wide band response is to be attained through low plate loads. A dual triode 12 serves as the twin stages of the phase inverter section, with output from the plate of the second stage pentode 11 being coupled to the grid of the upper section 12U of the phase inverter. Power tubes of the push-pull stage are also pentodes and were selected for their superior heat dissipation capabilities.

Each section of the phase inverter stage 12 has RC coupling to the grid of a corresponding section of the push-pull stage 13; however, the values are such that at low frequency, the coupling is essentially D.C. and hence, no phase shift is introduced. This technique compensates in part for the added phase shift due to the extra stage of amplification that is employed in accordance with this invention for the purpose of making available the added gain required to enable a high value of feedback to be employed around the main loop L.

As mentioned previously, additional low frequency compensation is afforded by the positive feed forward loop F1 which includes elements C10, C12, R19 and R20 connected in circuit from the plate of the first stage pentode to the grid of the lower section 12L of the phase inverter stage. The time constants of R20 and C12 provide bypass of signals below 10 cycles and, in effect, apply a positive feed from the plate of the first stage 10 to make it possible to balance out low frequency phase shift between the first and third stages.

With these low frequency provisions, the output transformer 14 remains as the chief contributor to overall low frequency phase shift. In general, damped oscillations cannot be sustained with less than 170° phase shift and while the transformer phase shift is never less than 90° at very low frequencies, a great margin remains and the amplifier is completely stable at low frequency, even with 50 dbs. of negative feedback applied over the main feedback loop L which includes the elements R39, C17, and R3.

The loops F2, F3, and F4 provide the required high frequency stability. Specifically, loop F3 including elements C11, C9*a*, R16 and R17 provides negative feedback from the plate of the lower section 13L of the push-pull stage to the plate circuit of the second stage pentode 11 and these circuit elements are selected to eliminate oscillations above 500 kc. Loop F4 including elements C16, C15, R35 and R36, is connected from the plate of the upper section 13U of the push-pull stage to the main feedback loop L and hence, to the cathode of the first stage pentode 10 to eliminate oscillations above 100 kc. Finally, loop F2 including elements C7, C9 and R12, is connected from the plate of the input section 12U of the phase inverter stage to the cathode of the second stage pentode 11 to eliminate oscillations above 20 kc.

In the diagram of FIG. 4 there is additionally shown a positive feedback loop that includes elements R40 and C18 connected from the 8 ohm lead of the output transformer 14. This loop provides sufficient positive feedback to handle a speaker having a high capacitance, and is relatively unimportant where the load of the speaker employed is predominantly resistive. This additional loop is useful where a highly reactive 8 ohm speaker load is employed.

With these novel circuit features for controlling phase shift and hence, stability at the high and low frequency ends, the overall negative feedback delivered over the main loop L could be increased until unity gain is reached, without encountering instability. Certain variations in the time constants of the various phase shift control loops would be required. In addition, the specific values given for the time constants in the diagram of FIG. 4 are related particularly to the roll off characteristic of the specific output transformer therein and variations are contemplated where a different output transformer having a different roll off characteristic is employed.

As explained previously, a value for inter-modulation distortion was arrived at by extrapolation indicating that for power levels up to about 5 watts, the inter-modulation distortion is on the order of .005 percent and is only on the order of 0.01 percent for power levels up to 20 watts. The total power available before sine wave clipping is 40 watts, with smooth overload characteristics above that value. Frequency response is within 2 dbs from five cycles to 60 kc. and phase shift is below 127° from two cycles to 200 kc. Sensitivity is one volt in for full output.

One important practical advantage of the present amplifier is that its use of such large amounts of feedback prevents aging of the tubes and of other circuit components from having any effect upon circuit performance. Therefore, years of maintenance-free operation can be expected without any degrading of performance.

It is recognized that many authorities are of the opinion that distortion reduction below 1% is academic because the human ear no longer can detect distortion that low. Nevertheless, side by side comparison of the equipment disclosed herein with conventional high quality equipment shows that the equipment of this invention exhibits spectacular definition and alacrity. One important reason for this is that the speaker S, as connected to the secondary of the output transformer 14 becomes part of the main feedback loop L and the 50 db feedback thus acts also to hold down the speaker distortion. Since it is widely agreed that speaker distortion is the most serious problem in high fidelity sound systems, one of the most important features of the invention derives from the action of the large feedback in minimizing speaker distortion.

While a preferred embodiment of the invention has been illustrated herein, it is to be understood that changes and variations may be made by those skilled in the art without departing from the spirit and scope of the appended claims.

What is claimed is:

1. A power amplifier of high fidelity for driving a speaker through an output transformer having a secondary for connection to said speaker, said amplifier including successively connected tube stages comprising a first stage of amplification, a second stage of amplification, a phase inverter third stage, and a push-pull output stage connected to said output transformer, said amplifier having a main feedback loop connected from the secondary of said transformer to a control point within the first stage to supply 40 dbs of negative feedback, and said amplifier including stage inter-connection means maintaining the overall low frequency phase shift due to all of said stages within a range that is substantially smaller than the low frequency phase shift contributed by said output transformer, means providing a negative feedback loop responsive at 5000 kc. and above connecting the output from one section of the push-pull stage to the output from the second stage, means providing a negative feedback loop responsive at 1000 kc. and above connecting the output from another section of the push-pull stage to said main feedback loop, and means providing a negative feedback loop responsive at 20 kc. and above connecting the output from the phase inverter stage to a control point within the second stage.

2. A power amplifier of high fidelity for driving a speaker through an output transformer having a secondary for connection to said speaker, said amplifier including successively connected tube stages comprising a first stage of amplification, a second stage of amplification, a phase inverter third stage, and a push-pull output stage connected to said output transformer, said amplifier having a main feedback loop connected from the secondary of said transformer to a control point within the first stage to supply 40 dbs of negative feedback, and said amplifier including stage interconnection circuitry establishing essentially D.C. coupling from the phase inverter stage to the push-pull stage, means providing a low frequency positive feed-forward loop between output from the first stage and a control point within the phase inverter stage, means providing a negative feedback loop responsive at 500 kc. and above connecting the output from one section of the push-pull stage to the output from the second stage, means providing a negative feedback loop responsive at 100 kc. and above connecting the output from another section of the push-pull stage to said main feedback loop, and means providing a negative feedback loop responsive at 20 kc. and above connecting the output from the phase inverter stage to a control point within the second stage.

3. A power amplifier of high fidelity for driving a speaker through an output transformer having a secondary for connection to said speaker, said amplifier including successively connected stages comprising a first amplication stage having a tube that includes a plate for output, a cathode, and a grid for input, a second amplifications stage having a tube that includes a plate for output, a cathode, and a grid for input, a phase inverter third stage having dual sections, each having a tube that includes a plate for output, a cathode, and a grid, and a push-pull output stage having balanced sections each having a tube that includes a plate connected to the transformer, a cathode, and a grid for input, said amplifier having a main feedback loop connected from the secondary of said transformer to the cathode of said first stage to supply 40 dbs of negative feedback, and said amplifier including stage interconnection means for maintaining the overall low frequency phase shift due to all of said stages within a range that is substantially smaller than the low frequency phase shift contributed by said output transformer, means providing a negative feedback loop responsive at 500 kc. and above connecting the plate from one section of the push-pull stage to the plate of the second stage, means providing a negative feedback loop responsive at 100 kc. and above connecting the plate from the other section of the push-pull stage to the main feedback loop, and means providing a negative feedback loop responsive at 20 kc. and above connecting the plate of one section of the phase inverter stage to the cathode of the second stage.

4. A power amplifier of high fidelity for driving a speaker through an output transformer having a secondary for connection to said speaker, said amplifier including successively connected stages comprising a first amplification stage having a tube that includes a plate for output, a cathode, and a grid for input, a second amplification stage having a tube that includes a plate for output, a cathode, and a grid for input, a phase inverter third stage having dual sections, each having a tube that includes a plate for output, a cathode, and a grid, and a push-pull output stage having balanced sections each having a tube that includes a plate connected to the transformer, a cathode, and a grid for input, said amplifier having a main feedback loop connected from the secondary of said transformer to the cathode of said first stage to supply 40 dbs of negative feedback, and said amplifier including stage interconnection circuitry between said second and third stages comprising a circuit connected from the plate of said second stage to the grid of one section of the phase inverter stage, and a separate stage interconnection circuit from the plate of each phase inverter section to the grid of a corresponding push-pull section for establishing essentially D.C. coupling from the phase inverter stage to the push-pull stage, means providing a low frequency positive feed forward loop from the plate of said first stage to the grid of the other section of the phase inverter stage, means providing a negative feedback loop responsive at 500 kc. and above connecting the plate from one section of the push-pull stage to the plate of the second stage, means providing a negative feedback loop responsive at 100 kc. and above connecting the plate from the other section of the push-pull stage to the main feedback loop, and means providing a negative feedback loop responsive at 20 kc. and above connecting the plate of said one section of the phase inverter stage to the cathode of the second stage.

References Cited by the Examiner

UNITED STATES PATENTS

| | | | |
|---|---|---|---|
| 2,246,158 | 6/1941 | Worcester | 330—75 X |
| 2,281,238 | 4/1942 | Greenwood | 330—99 |
| 2,748,201 | 5/1956 | McMillan | 330—100 X |
| 2,876,299 | 3/1959 | Robins | 330—104 X |
| 2,891,117 | 6/1959 | Coleman | 330—81 |

ROY LAKE, *Primary Examiner.*

R. P. KANANEN, *Assistant Examiner.*